United States Patent [19]
Golshan et al.

[11] Patent Number: 5,384,488
[45] Date of Patent: Jan. 24, 1995

[54] CONFIGURATION AND METHOD FOR POSITIONING SEMICONDUCTOR DEVICE BOND PADS USING ADDITIONAL PROCESS LAYERS

[75] Inventors: Shahin Golshan; Craig A. St. Martin; Craig W. Rhodine, all of Midland, Tex.

[73] Assignee: Texas Instruments Incorporated, Dallas, Tex.

[21] Appl. No.: 135,867

[22] Filed: Oct. 3, 1993

Related U.S. Application Data

[62] Division of Ser. No. 898,868, Jun. 15, 1992, abandoned.

[51] Int. Cl.[6] .................. H01L 23/48; H01L 29/46; H01L 29/62; H01L 29/64
[52] U.S. Cl. .................................. 257/786; 257/692
[58] Field of Search .................. 257/786, 784, 692

[56] References Cited

U.S. PATENT DOCUMENTS

| | | | |
|---|---|---|---|
| 4,060,828 | 11/1977 | Satonaka | 257/784 |
| 4,878,098 | 10/1989 | Saito et al. | 257/786 |
| 4,914,055 | 4/1990 | Gordon et al. | 437/245 |
| 4,983,250 | 1/1991 | Pan | 437/192 |
| 5,102,831 | 4/1992 | Haga | 437/220 |
| 5,198,385 | 3/1993 | Devitt et al. | 437/182 |
| 5,250,840 | 10/1993 | Oh et al. | 257/786 |

*Primary Examiner*—Andrew J. James
*Assistant Examiner*—S. V. Clark
*Attorney, Agent, or Firm*—Robby T. Holland; Wade James Brady, II; Richard L. Donaldson

[57] ABSTRACT

A semiconductor chip (12) includes a plurality of bond pads (16). A plurality of bond shelves (28) are located along opposed end edges (20, 22) of the chip (12). The bond pads (16) are oriented in selected areas remote from the bond shelves (28). A via (42) is formed through an insulating layer (38) to the surface of the bond pad (18) to provide electrical connection thereto. A metallization layer (44) is formed over the an insulating layer (38), filling the via (42). The metallization layer (44) is patterned and etched to form a patten of trace lines (18) spatially separated to connect each bond pad (16) to bond shelves (28).

9 Claims, 2 Drawing Sheets

CONFIGURATION AND METHOD FOR POSITIONING SEMICONDUCTOR DEVICE BOND PADS USING ADDITIONAL PROCESS LAYERS

This application is a division of application Ser. No. 07/898,868, filed Jun. 15, 1992.

TECHNICAL FIELD OF THE INVENTION

The present invention relates to integrated circuit technology and, more particularly, to a configuration and method for positioning bond pads using additional process layers.

BACKGROUND OF THE INVENTION

Currently, hermetic/ceramic semiconductor packages are designed around the layout of the device to be built. Traditionally, the bond pads usually lie along both the side and end edges of a semiconductor chip. Bond wires connect the bond pads to bond shelves, or lead fingers, located along the perimeter of the device. Typically, the wire bonds are made of aluminum or gold. The bond pad locations of the device dictate the placement of the bond shelves in the package design and thus dictate the final package dimensions and style availability. For military/avionics and other high reliability uses, the chip is encapsulated in ceramic.

Ceramic packaging is considerably more expensive than typical plastic packaging. Most high reliability applications prefer that ceramic packaging be interchangeable with plastic packaging with respect to size/footprint dimensions and assembly requirements. Accordingly, customers could use plastic parts in trial uses and invest in ceramic parts for their final high reliability use. Designing the package around the original semiconductor chip having bond shelves on all four sides typically results in ceramic packages much larger than their plastic counterparts. While traditional assembly techniques allow the semiconductor chip to be hermetically packaged, they do not allow the flexibility in either the package design or assembly processing necessary to achieve the more compact plastic package footprint and dimensions.

The 16 MB DRAM design is the first generation DRAM configured with center bond pads. Bond wires extending from the bond pad to the bond shelf across much chip real estate poses assembly difficulties as well as reliability risks. The 4 MB DRAM presently has bond shelves formed along all side and end edges of the chip, requiring ceramic packages wider than optimal.

U.S. Pat. No. 5,083,187 issued to Lamson, et al. (hereinafter, the "'187 Patent") describes an integrated circuit device having an electrical circuit connected to a bond pad. A metal layer overlies the bond pad and a metal bump is connected to the metal layer. The metal bump receives power for the electrical circuit. The on metal bump of the '187 Patent eliminates the need for bond wires.

A long felt need exists for a conventionally configured chip that can be conventionally assembled in a narrow ceramic package. Additionally, a long felt need continues to exist for an improved configuration for a chip having center bond pads that provides a compact package that can be hermetically sealed.

SUMMARY OF THE INVENTION

According to the invention, an additional conductive process layer is used to reposition the bond pads of an integrated circuit device to allow flexibility in the package design. According to one aspect of the invention, an active circuit is formed on top of an integrated device. A plurality of bond shelves are located at opposed end edges of the chip. A plurality of bond pads are oriented in selected areas of the chip remote from the bond shelves, yet are in electrical contact with the active circuit. An insulation layer is formed over the chip. A via is formed through the insulation layer so that an electrical connection can be made to the bond pad through the via. A metal layer is formed over the insulation layer and the via, thus forming a metallized via for making electrical contact to the bond pad. The metal layer is patterned and etched to form a plurality of conductive trace lines on the face of the chip connected to each metallized via. A new relocated bond pad is then formed at the terminal end of the conductive trace line. A plurality of wire bonds are oriented along the two end edges of the chip for receiving power.

According to another aspect of the invention, a process is disclosed for fabricating an integrated circuit in a semiconductor chip having wire bonds on opposing end edges of the chip. A plurality of bond pads having metallized vias therein are located in areas on the chip remote from the end edges. A plurality of conductive trace lines are formed to electrically connect each metallized via to individual bond shelves using the wire bonds.

One technical advantage is that the present invention allows the bond pad locations of any device to be repositioned as required by the desired package. Consequently, the present invention allows and promotes package design independent of chip layout. Other technical advantages include minimization of the required ceramic package width or length and the allowance of conventional assembly for bonding large integrated circuits with center bond pads and other instances where bond pads are located remote from bond shelves. Finally, the pattern of conductive trace lines repositioning the bond pads of the present invention minimizes coupling, inductance and capacitance problems associated with the use of additional process layers.

BRIEF DESCRIPTION OF THE DRAWINGS

Other aspects of the invention and their advantages will be discerned as one refers to the following detailed description when taken in conjunction with the drawings, in which.

DETAILED DESCRIPTION OF THE INVENTION

The preferred embodiment of the present invention is best understood by referring to FIGS. 1-5 of the drawings, like numerals being used for like in corresponding parts of the various drawings.

Figure 1:
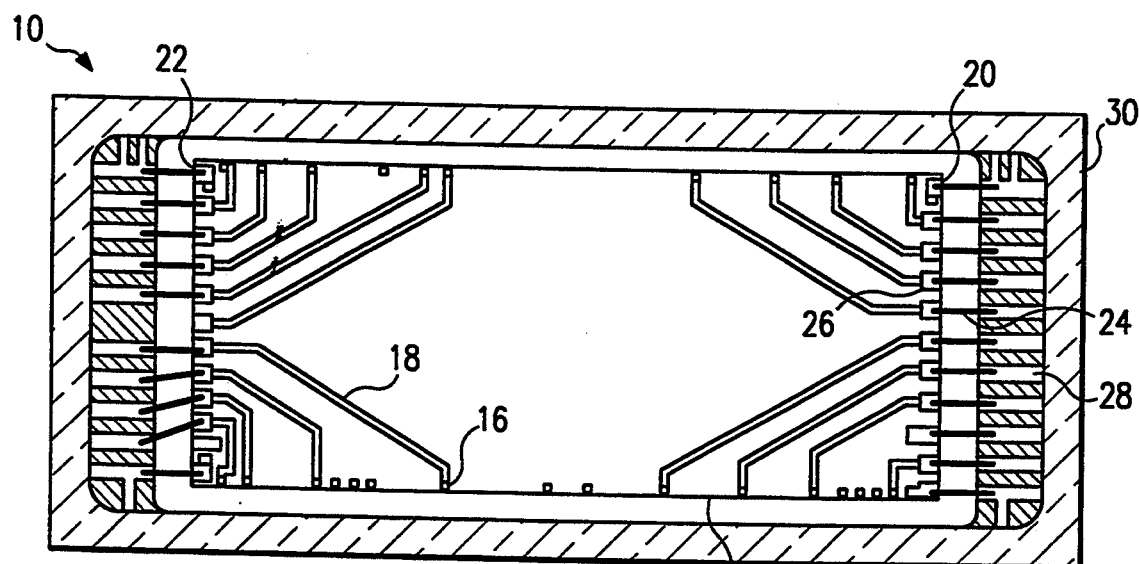
FIG. 1 is an enlarged schematic plan view of an integrated circuit device having original bond pads on all sides of a chip, employing the present invention.
Figure 2:
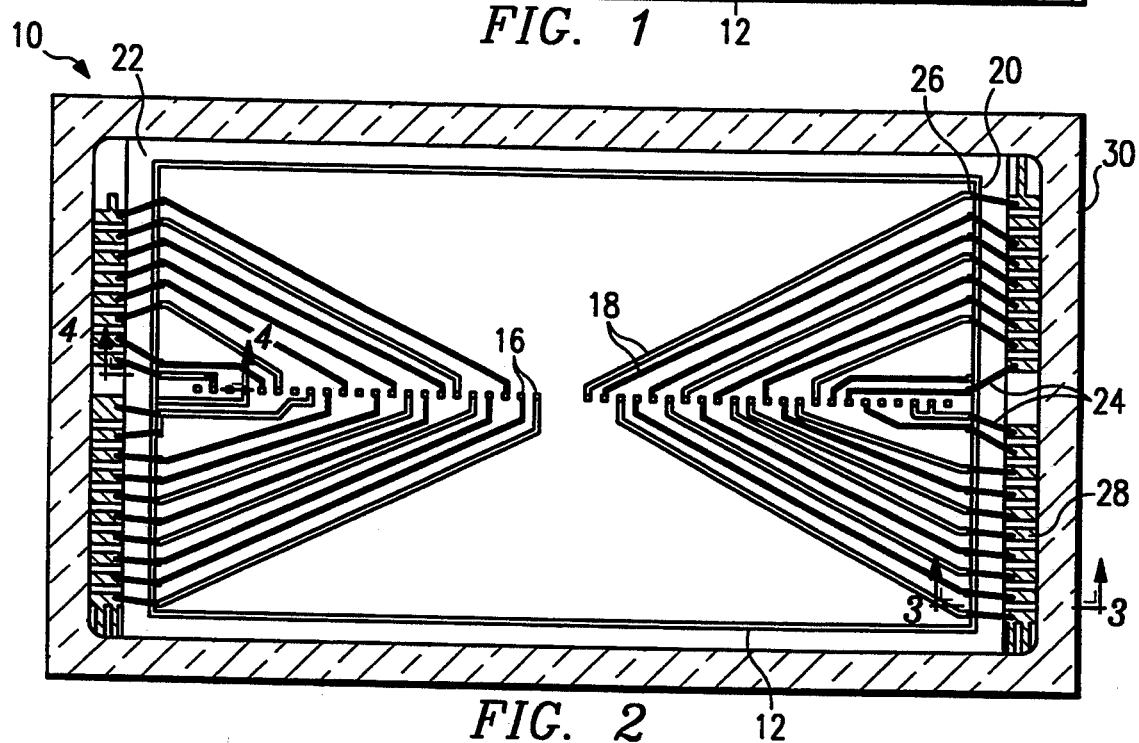
FIG. 2 is an enlarged schematic plan view of an integrated circuit device having center bond pads employing the present invention.

FIGS. 1 and 2 are top plan views illustrating two embodiments of an integrated circuit device of the present invention. Integrated circuit device 10 can be any semiconductor device, such as a DRAM, formed on semiconductor chip 12. The active devices, not shown, of chip 12 are connected to bond pads 16 for external connection. FIG. 1 depicts original bond pad locations 16 located on all four sides of the chip 12 in a conventional manner. FIG. 2 shows 45 original bond pad locations 16 oriented along a line bisecting the center of chip 12. Metallized reroute trace lines 18 are formed on the face of chip 12. Trace lines 18 connect the original bond pads 16 to the end edges 20 and 22 of chip 12 at the terminal end of trace lines 18, thus forming new bond pads 26. Bond wires 24 of relatively short length connect the new bond pads 26 of the trace lines 18 to a bond shelf 28.

In FIG. 1, the trace lines 18 and new bond pads 26 eliminate the need for bond shelves on all four sides of a chip 12. Accordingly, with bond shelves 28 located only on opposed ends 20 and 22 of chip 12, the package is relatively narrow.

In FIG. 2, the trace lines 18 and new bond pads 26 eliminate the need for bond wires having extended length to connect the centrally located original bond pads 16 to the bond shelves 28 as well as eliminating side bond shelves, resulting in a narrower package. A metallized seal ring 30 surrounds chip 12, for attaching a lid, as will be subsequently described.

Figure 3:
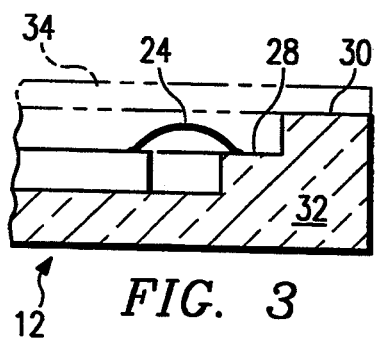
FIG. 3 is a magnified schematic elevational sectional view taken substantially along line 3—3 of FIG. 2.

FIG. 3 is a magnified schematic elevational sectional view taken substantially along lines 3—3 of FIG. 2. Semiconductor chip 12 (shown in detail in FIG. 4) is mounted within a ceramic, multilayer package 32 covered by lid 34 (indicated by dashed line). Lid 34 is formed of metal, and is preferably gold plated on its top and bottom surfaces. Lid 34 is soldered to metallized seal ring 30 in order to provide a hermetically sealed package. Bond wire 24 lies underneath lid 34 and electrically connects the chip 12 to the bond shelf 28. FIG. 3 illustrates the short required length of bond wires 24, which are also advantageously of approximately the same length. Cavity 35 is formed underneath lid 34 and between chip 12 and ceramic package 32.

Figure 4:
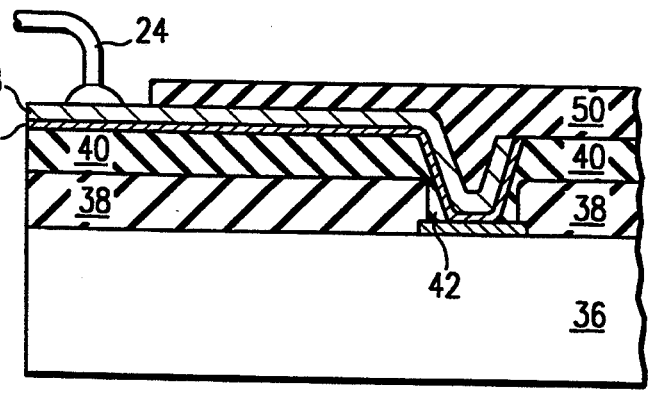
FIG. 4 is a highly magnified schematic elevational sectional view of the preferred embodiment taken substantially along line 4—4 of FIG. 2.

FIG. 4 is an enlarged schematic elevational sectional view taken generally along section lines 4—4 of FIG. 2 of semiconductor chip 12. Semiconductor chip 12 is formed of silicon layer 36, insulation layer 38, and polyimide layer 40. The active circuits are formed in silicon layer 36 as is well known in the art. Original bonding pad 16, typically of aluminum, is formed in a selected area on the surface of silicon layer 36. An insulation layer 38 is formed over silicon layer 36 and bond pad 16. Polyimide layer 40, which is optional unless a polyimide layer has not been applied during wafer fabrication by the supplier, is formed over insulation layer 38. The device is etched so that a via 42 is formed through both the polyimide layer 40 and the insulation layer 38 to the surface of bond pad 16. The combined thickness for insulation layer 38 and polyimide layer 40 is typically of 5 to 10 microns. Layers that are too thin will contribute to electrical coupling problems.

The polyimide layer helps to prevent electrical coupling problems between the trace lines 18 and the underlying metal (bitlines, in case of DRAM) of the active device, which are not shown. Additionally, the polyimide layer acts as a cushion to protect silicon layer 36 when mechanical pressure is used to connect bond wire 24 to the terminal end 26 of trace lines 18.

Once the via 42 is formed, an interconnection metallization layer 44 is attached to form an electrical connection to bond pad 16. Interconnection metallization layer 44 includes a barrier metal 46 and a reroute metal layer 48. Barrier metal layer 46 is deposited to cover aluminum bond pad 16 and other exposed areas. Barrier metal 46 is a reflective metal, including titanium, tungsten or a combination thereof and is deposited to a thickness of 2,000–3,000Ω. Layer 46 is then patterned and etched.

Next, according to the invention, reroute metal layer 48 is deposited to cover the barrier metal layer 46. Reroute metal layer 48 may be either gold, aluminum or another conductive material. The typical thickness of reroute metal layer 48 is approximately 3,000 to 10,000 angstroms if gold is used, or 1,500 to 2,000 angstroms if aluminum is used as reroute metal layer 48. Reroute metal layer 48 is patterned and etched to form rerouted conductive trace lines 18. Layers 46 and 48 may be deposited by sputtering in a single vacuum pump down in order to avoid contamination and oxidation of the interfaces. Photopatterning with conventional negative photoresist and proximity printing is adequate.

If aluminum is used for reroute metal layer 48, an additional polyimide layer 50 is formed on top of trace lines 18 to protect against corrosion or mechanical damage. A layer having a thickness of 0.5 micron is sufficient. If gold is used for the reroute metal layer 48, no additional polyimide layer 50 is necessary.

Bond wires 24 are then attached to new bond pads 26 of trace lines 18 by mechanical means in a conventional manner. (If aluminum has been used as the reroute metal layer 48, etching of the overlying polyimide layer 50 at the new bond location is required to make the bond wire 24 attachment.) Bond wires 24 may be formed of either gold or aluminum. Bond wires 24 are then attached to bond shelf 28 by conventional means. Finally, chip 12 is hermetically sealed by soldering a metal lid 34 over the chip 12 along the metallized seal ring 30.

External power is supplied to the active circuits of integrated device 10 and signals are transferred through the bond wires 24. The creation of new bond pads electrically connected to the original bond pads makes it possible to design semiconductor chips without regard to bond pad placement on chip 12. The contacts to the points of current distribution can be rearranged and spaced as necessary. The power supply bus has lower resistance, low inductance, and minimization of voltages drops all of which decrease noise to increase device performance.

Figure 5:
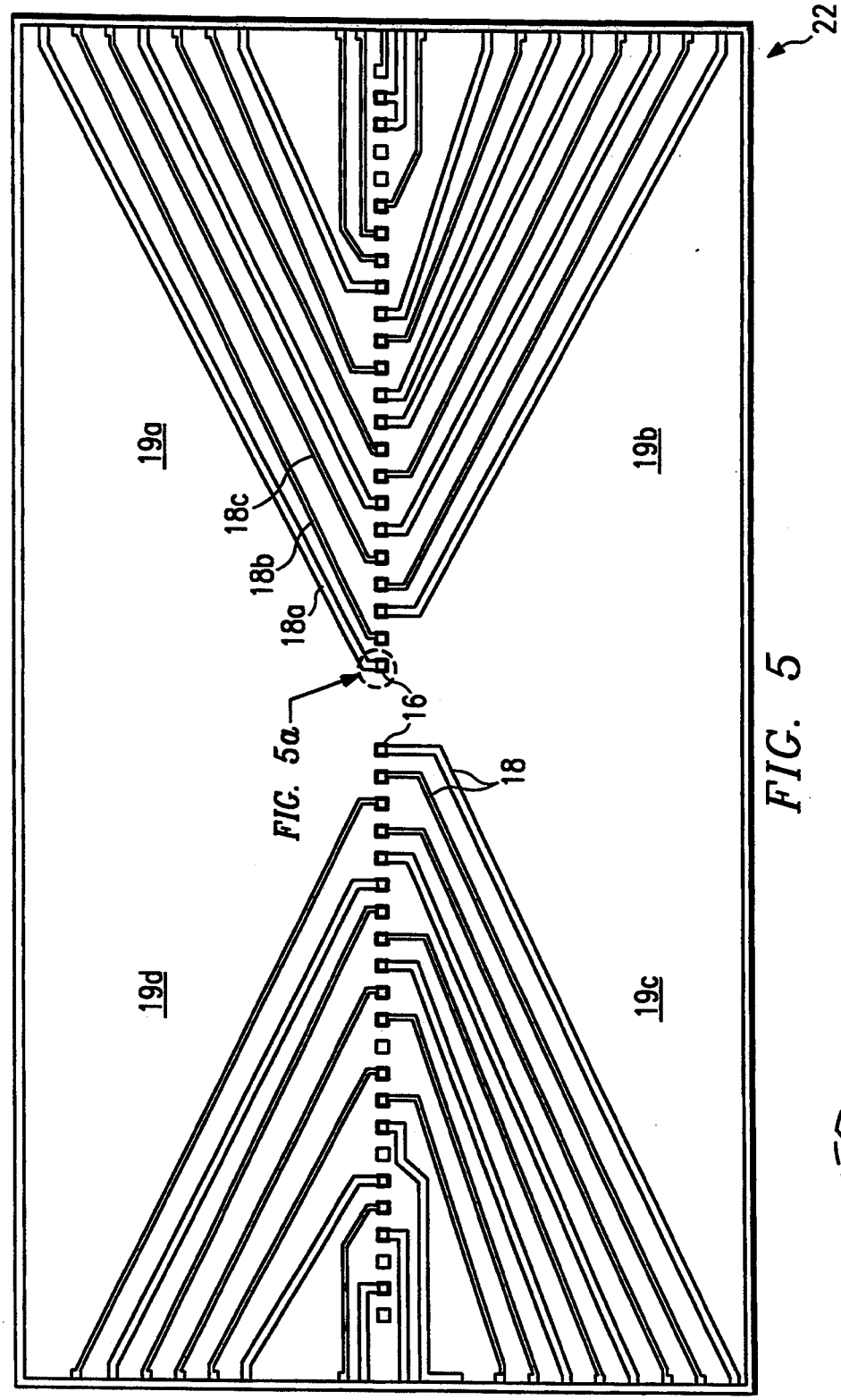
FIG. 5 is an enlarged schematic plan view of a chip having center bond pads using the present invention, with FIG. 5a showing an enlarged detailed plan view of a bond pad and metallized via of the present invention.

FIG. 5 is an enlarged plan view of the reroute design of FIG. 2 having center bond pads according to the present invention. As shown, the bond pads are oriented along a line bisecting the center of chip 12. The triangular configuration pattern of the conductive trace lines 18 essentially divides the face of chip 12 into four substantially identical quadrants 19a, b, c and d. Exemplary trace lines 18a and 18b, separated by space 18c are generally parallel. Careless design of the conductive trace lines 18 to connect the bond pad 16 to bond wire 24 may introduce electrical coupling problems associated with integrated circuits, such as bitlines, in the case of DRAMs. The triangular configuration illustrated reduces electrical coupling capacitance and inductance problems for the device illustrated.

The width and length of the conductive trace line 18 are important to reduce coupling problems. If gold is used as reroute metal layer 48, the conductive trace line 18 width is about 120 microns. If aluminum is used as the reroute metal layer 48, the typical width for an aluminum conductive trace line 18 is approximately 50 microns. Additionally, shorter lines produce better results.

The angle 45 of the conductive trace line 18 with respect to the underlying metal is also important with respect to coupling problems. To avoid the need for additional thickness of polyimide to prevent cross-talking between the underlying metal and trace lines 18, the angle 45 is optimally greater than about 20°. Preferably, angle 45 is 45°.

Figure 5A:
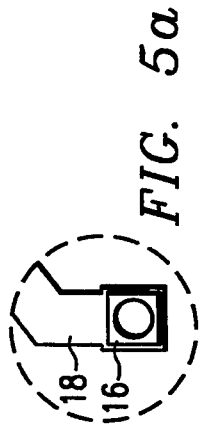

FIG. 5a shows an enlarged detail top view of the bond pad 16, the metallized via 42 and the rerouted conductive trace line 18 of the present invention. While the plan view of FIGS. 1, 2 and 5 refer to bond pads 16, bond pads 16 are actually not shown because metallized via 42 covers the original bond pad. Bond pads 16 are referred to for ease of discussion.

The present invention yields several advantages, including but not limited to, the following. Bond pads 16 may be placed on any location without redesign of the circuit in question. Bond wires are not required to be of extensive length because connection need only be made from the bond shelf 28 to the end edge of the semiconductor chip 12. The present invention allows DRAMs or any device having a non-conventional bond pad 16 layout to be assembled in hermetic packages using conventional assembly.

Although the present invention and its advantages have been described in detail, it should be understood that various changes, substitutions, and alterations can be made herein without departing from the spirit and scope of the invention as defined by the appended claims.

What is claimed is:

1. An integrated circuit device using additional process layers for positioning bond pads, comprising:
   a semiconductor chip having an active circuit formed in a face thereof, said chip having opposed end edges;
   a plurality of bond pads in electrical contact with said active circuit oriented along a center line of said chip;
   an insulating layer overlying said active circuit and having vias to enable electrical connection to said bond pads through said vias;
   a patterned conductive layer overlying said insulating layer and said vias, forming conductive vias for transferring signals from said bond pads;
   said patterned conductive layer also forming a plurality of conductive trace lines connecting said conductive vias to said end edges of said chip; and
   a plurality of wire bonds oriented along each of said end edges for being connected to terminal ends of said trace lines.

2. An integrated circuit device using additional process layers for positioning bond pads, comprising:
   a semiconductor chip having an active circuit formed in a face thereof, said chip having opposed end edges;
   a plurality of bond pads in electrical contact with said active circuit oriented in selected areas remote from said end edges;
   an insulating layer overlying said active circuit and having vias to enable electrical connection to said bond pads through said vias;
   a patterned conductive layer having a second conductive layer overlying a first reflective layer overlying said insulating layer and said vias, forming conductive vias for transferring signals from said bond pads,
   said patterned conductive layer also forming a plurality of conductive trace lines connecting said conductive vias to said end edges of said chip; and
   a plurality of wire bonds oriented along each of said end edges for being connected to terminal ends of said trace lines.

3. The device of claim 2, wherein said second conductive layer comprises gold.

4. The device of claim 2, wherein said second conductive layer comprises aluminum.

5. The device of claim 4, further comprising:
   a polyimide layer overlaying said second conductive layer.

6. The device of claim 2, wherein said first reflective layer is selected from the group consisting of titanium, tungsten or a combination thereof.

7. An integrated circuit device using additional process layers for positioning bond pads, comprising:
   a semiconductor chip having an active circuit formed in a face thereof, said chip having opposed end edges;
   a plurality of bond pads in electrical contact with said active circuit oriented in selected areas remote from said end edges;
   an insulating layer overlying said active circuit and having vias to enable electrical connection to said bond pads through said vias;
   a patterned conductive layer overlying said insulating layer and said vias forming conductive vias for transferring signals from said bond pads;
   said patterned conductive layer also forming a plurality of conductive trace lines connecting said conductive vias to said end edges of said chip;
   a plurality of wire bonds oriented along each of said end edges for being connected to terminal ends of said trace lines; and
   wherein said conductive trace lines extend from said wire bonds to said bond pads in four substantially identical quadrants of said chip, each quadrant of said chip having conductive trace lines formed substantially parallel to each other.

8. The device of claim 7, wherein said trace lines are formed at an angle of approximately 20 degrees or greater.

9. The device of claim 8, wherein said angle is 45 degrees.

* * * * *